US00RE49661E

(19) United States
(12) Reissued Patent
Seko

(10) Patent Number: US RE49,661 E
(45) Date of Reissued Patent: Sep. 19, 2023

(54) SOLID STATE IMAGING DEVICE AND MANUFACTURING METHOD, AND ELECTRONIC APPARATUS

(71) Applicant: Sony Semiconductor Solutions Corporation, Kanagawa (JP)

(72) Inventor: Hiroaki Seko, Kanagawa (JP)

(73) Assignee: SONY SEMICONDUCTOR SOLUTIONS CORPORATION, Kanagawa (JP)

(21) Appl. No.: 16/408,121

(22) Filed: May 9, 2019

Related U.S. Patent Documents

Reissue of:
(64) Patent No.: 9,356,064
Issued: May 31, 2016
Appl. No.: 14/204,847
Filed: Mar. 11, 2014

U.S. Applications:
(63) Continuation of application No. 16/393,722, filed on Apr. 24, 2019, now Pat. No. Re. 49,333, which is an application for the reissue of Pat. No. 9,356,064, said application No. 16/393,722 is a continuation of application No. 15/594,189, filed on May 12, 2017, now Pat. No. Re. 47,392, which is an application for the reissue of Pat. No. 9,356,064, said application No. 15/594,189 is a continuation of application No. 15/593,786, filed on May 12, 2017, now Pat. No. Re.
(Continued)

(30) Foreign Application Priority Data

Mar. 18, 2013 (JP) ..... 2013-054588

(51) Int. Cl.
*H01L 27/146* (2006.01)

(52) U.S. Cl.
CPC .... *H01L 27/14621* (2013.01); *H01L 27/1463* (2013.01); *H01L 27/1464* (2013.01); *H01L 27/14627* (2013.01); *H01L 27/14685* (2013.01); *H01L 27/14687* (2013.01)

(58) Field of Classification Search
CPC ..... H01L 27/14621; H01L 27/14685; H01L 27/1463; H01L 27/1464; H01L 27/14687; H01L 27/14627
See application file for complete search history.

(56) References Cited

U.S. PATENT DOCUMENTS 9,356,064 B2 5/2016 Seko
RE47,391 E 5/2019 Seko
(Continued)

FOREIGN PATENT DOCUMENTS

JP 2011-239070 11/2011
JP 2011-239070 A 11/2011

*Primary Examiner* — Minh Nguyen
(74) *Attorney, Agent, or Firm* — SHERIDAN ROSS P.C.

(57) ABSTRACT

A solid state imaging device includes a substrate, in which the substrate includes a photoelectric conversion unit that generates a charge according to a light amount of incident light by a pixel unit, an accumulation unit that divides the charge of the pixel unit which is generated in the photoelectric conversion unit and accumulates the charge, a first element isolation unit that is formed at a boundary of the photoelectric conversion unit of the pixel unit, and a second element isolation unit that is formed at a boundary of the accumulation unit of a divided unit of the pixel.

22 Claims, 9 Drawing Sheets

Related U.S. Application Data

47,391, which is an application for the reissue of Pat. No. 9,356,064.

(56) References Cited

U.S. PATENT DOCUMENTS

| | | | | |
|---|---|---|---|---|
| RE47,392 | E | 5/2019 | Seko | |
| 2008/0283728 | A1* | 11/2008 | Inoue | H04N 9/04553 438/48 |
| 2010/0013969 | A1* | 1/2010 | Ui | H04N 5/378 348/294 |
| 2010/0200738 | A1* | 8/2010 | Yamashita | H01L 27/14685 250/227.11 |
| 2011/0128429 | A1* | 6/2011 | Endo et al. | 348/308 |
| 2011/0141333 | A1* | 6/2011 | Naruse et al. | 348/308 |
| 2011/0234875 | A1* | 9/2011 | Maeda | H04N 5/37457 348/308 |
| 2012/0217602 | A1* | 8/2012 | Enomoto | 257/432 |
| 2014/0347538 | A1* | 11/2014 | Toda | H01L 27/14605 257/292 |

* cited by examiner

SOLID STATE IMAGING DEVICE AND MANUFACTURING METHOD, AND ELECTRONIC APPARATUS

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS REFERENCE TO RELATED APPLICATIONS

This application *is a continuation of U.S. patent application Ser. No. 16/393,722, filed Apr. 24, 2019, and an application for reissue of U.S. Pat. No. 9,356,064, which application Ser. No. 16/393,722 is a continuation of U.S. patent application Ser. No. 15/594,189, filed May 12, 2017, now U.S. Pat. No. RE47,392, and an application for reissue of U.S. Pat. No. 9,356,064, which application Ser. No. 15/594,189 is a continuation of U.S. patent application Ser. No. 15/593,786, filed May 12, 2017, now U.S. Pat. No. RE47,391, and an application for reissue of U.S. Pat. No. 9,356,064, which application Ser. No. 15/593,786 is an application for reissue of U.S. patent application Ser. No. 14/204,847, filed Mar. 11, 2014, now U.S. Pat. No. 9,356,064, which* claims the benefit of Japanese Priority Patent Application JP 2013-054588 filed Mar. 18, 2013, the entire contents of *each of* which are incorporated herein by reference.

BACKGROUND

The present disclosure relates to a solid state imaging device and a manufacturing method, and an electronic apparatus, in particular, to a solid state imaging device and a manufacturing method, and an electronic apparatus which are able to prevent a deterioration in transfer while suppressing a decrease in sensitivity.

In recent years, in the solid state imaging device, expanding an area of a light receiving surface by enlarging a pixel size, in order to realize the high sensitivity has been considered. However, when the pixel size increases, a transfer length becomes long, and thus transfer efficiency deteriorates.

Therefore, there is disclosed a method that makes the transfer length short by dividing the pixel and arranging a transfer transistor with respect to each divided pixel and is able to prevent the deterioration of the transfer efficiency along with lowering a voltage (for example, see Japanese Unexamined Patent Application Publication No. 2011-239070).

SUMMARY

However, in the method described above, since it is necessary to form an element isolation unit that isolates the divided pixel between the divided pixels, an opening area of a photodiode is reduced and the sensitivity is decreased.

The present disclosure is made in view of such circumstances, and thus is able to prevent the deterioration in the transfer while suppressing the decrease in the sensitivity.

According to a first embodiment of the present disclosure, there are provided a solid state imaging device and an electronic apparatus each including a substrate, in which the substrate includes a photoelectric conversion unit that generates a charge according to a light amount of incident light by a pixel unit, an accumulation unit that divides the charge of the pixel unit which is generated in the photoelectric conversion unit and accumulates the charge, a first element isolation unit that is formed at a boundary of the photoelectric conversion unit of the pixel unit, and a second element isolation unit that is formed at a boundary of the accumulation unit of a divided unit of the pixel.

In the first embodiment of the present disclosure, the photoelectric conversion unit generates the charge according to the light amount of the incident light by the pixel unit, the accumulation unit divides the charge of the pixel unit which is generated in the photoelectric conversion unit and accumulates the charge, the first element isolation unit is formed at the boundary of the photoelectric conversion unit of the pixel unit, and the second element isolation unit is formed at the boundary of the accumulation unit of the divided unit of the pixel.

According to a second embodiment of the present disclosure, there is provided a manufacturing method for a manufacturing apparatus of a solid state imaging device, including forming a photoelectric conversion unit that generates a charge according to a light amount of incident light by a pixel unit on a substrate, forming an accumulation unit that divides the charge of the pixel unit which is generated in the photoelectric conversion unit and accumulates the charge on the substrate, forming a first element isolation unit that is formed at a boundary of the photoelectric conversion unit of the pixel unit on the substrate, and forming a second element isolation unit that is formed at a boundary of the accumulation unit of a divided unit of the pixel on the substrate.

In the second embodiment of the present disclosure, the photoelectric conversion unit that generates the charge according to the light amount of the incident light by the pixel unit is formed on the substrate, the accumulation unit that divides the charge of the pixel unit which is generated in the photoelectric conversion unit and accumulates the charge is formed on the substrate, the first element isolation unit that is formed at a boundary of the photoelectric conversion unit of the pixel unit is formed on the substrate and the second element isolation unit that is formed at a boundary of the accumulation unit of the divided unit of the pixel is formed on the substrate.

According to the first embodiment of the present disclosure, it is possible to prevent the deterioration in the transfer while suppressing the decrease in the sensitivity.

Furthermore, according to the second embodiment of the present disclosure, it is possible to manufacture the solid state imaging device that can prevent the deterioration in the transfer while suppressing the decrease in the sensitivity.

DETAILED DESCRIPTION OF EMBODIMENTS

Premise of Present Disclosure

Figure 1:
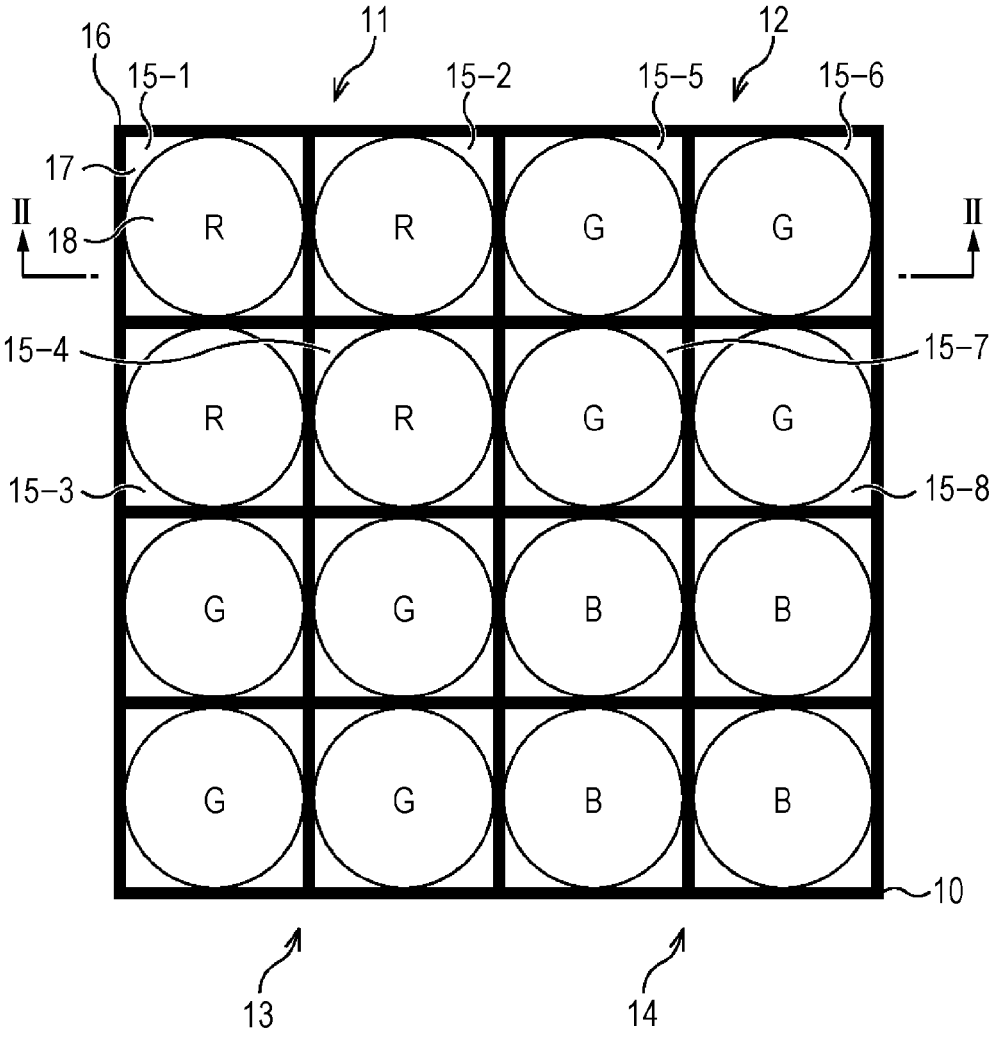
FIG. 1 is a plan view seen from an incident side of light of a pixel array in a CMOS image sensor which is a back side irradiation type.
Figure 2:
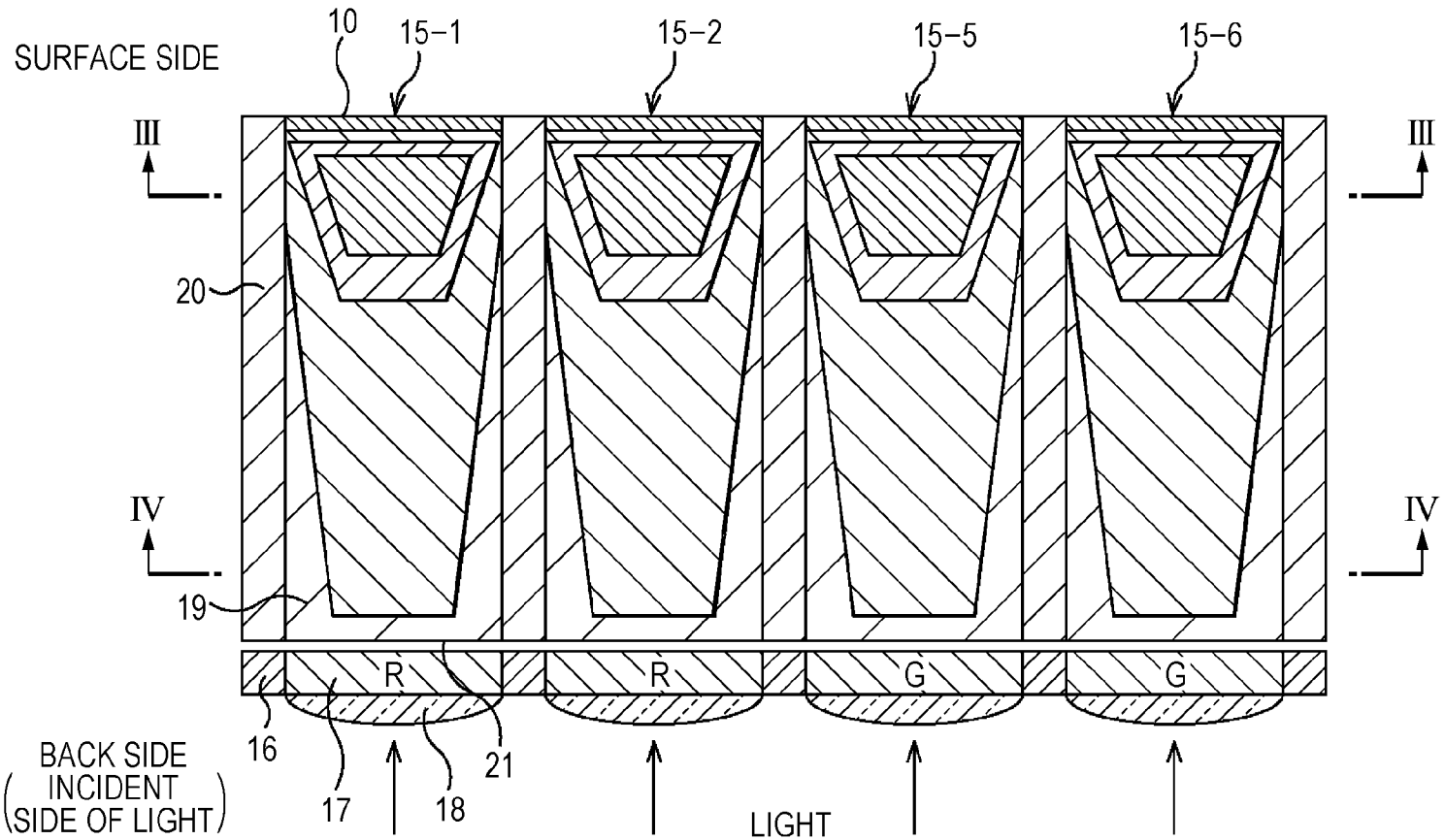
FIG. 2 is a sectional view taken along the line II-II in FIG. 1.

FIG. 1 is a plan view seen from an incident side of light of a pixel array in a CMOS (Complementary Metal-Oxide Semiconductor) image sensor which is a back side irradiation type as a solid state imaging device when a pixel is divided into 2×2 pieces. Furthermore, FIG. 2 is a sectional view taken along the line II-II in FIG. 1.

In FIG. 1, for convenience of description, only the 2×2 pieces of the pixel which is arranged in the pixel array are shown. In the example of FIG. 1, an arrangement of each pixel is a Bayer array. That is, a pixel 11 of the upper left is the pixel of red color (R), a pixel 12 of the upper right and a pixel 13 of the lower left are the pixels of green color (G), and a pixel 14 of the lower right is the pixel of blue color (B).

As shown in FIG. 1, each of the pixel 11 to the pixel 14 are divided into 2×2 pieces, and are formed on a substrate (semiconductor substrate) 10 of the pixel array. Specifically, the pixel 11 is formed of the four pieces as the divided pixels 15-1 to 15-4, and the pixel 12 is formed of the four pieces as the divided pixels 15-5 to 15-8. The pixel 13 and the pixel 14 are formed in the same manner.

Hereinafter, when it is not necessary to distinguish between the divided pixels 15-1 to 15-8 in particular, the divided pixels 15-1 to 15-8 are collectively referred to as a divided pixel 15. Similarly, the pixels 11 to 14 are collectively referred to as a pixel 11A.

Furthermore, as shown in FIG. 2, a photodiode 19 which is a photoelectric conversion element or the like is arranged inside the substrate 10 of the divided pixel 15. Moreover, inside the substrate 10 at a boundary of the divided pixel 15, an element isolation unit 20 is formed from the incident side (back side) of the light of the substrate 10 to an opposite side thereof (surface side).

In this manner, since the element isolation unit 20 is arranged from the back side of the substrate 10 to the surface side thereof, an opening unit 21 of the photodiode 19 is merely reduced by the element isolation unit 20, in comparison with the case where the element isolation unit 20 is not formed. As a result, the sensitivity is decreased.

In FIG. 2, a solid line that is described in the photodiode 19 is a contour of a potential.

Furthermore, as shown in FIG. 1 and FIG. 2, a light shielding metal 16 that shields incident light is arranged on the back side of the substrate 10 of the element isolation unit 20. On the back side of the substrate 10 of the photodiode 19 of each divided pixel 15, a color filter 17 of the color which is assigned to the pixel 11A including the divided pixel 15, and an on-chip lens 18 that concentrates the incident light to the photodiode 19 are arranged in order from the substrate 10 side.

Figure 3:
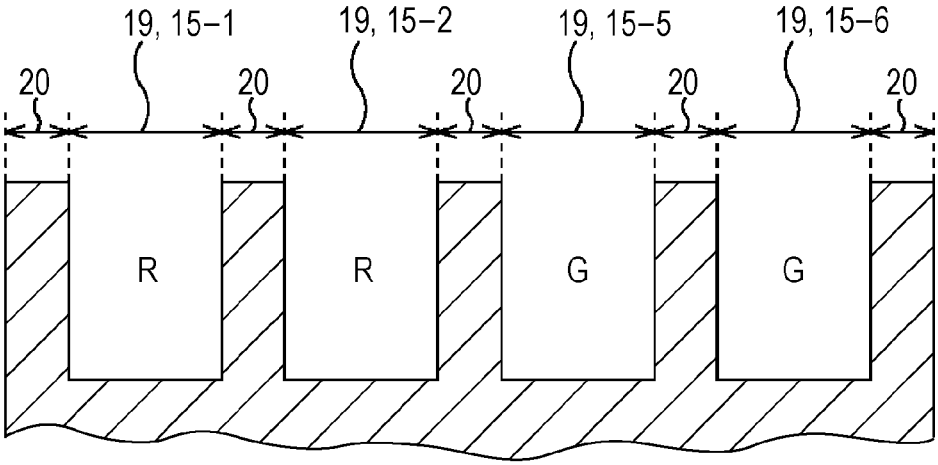
FIG. 3 is a sectional view illustrating an outline of a potential state of each divided pixel, taken along the line III-III in FIG. 2.
Figure 4:
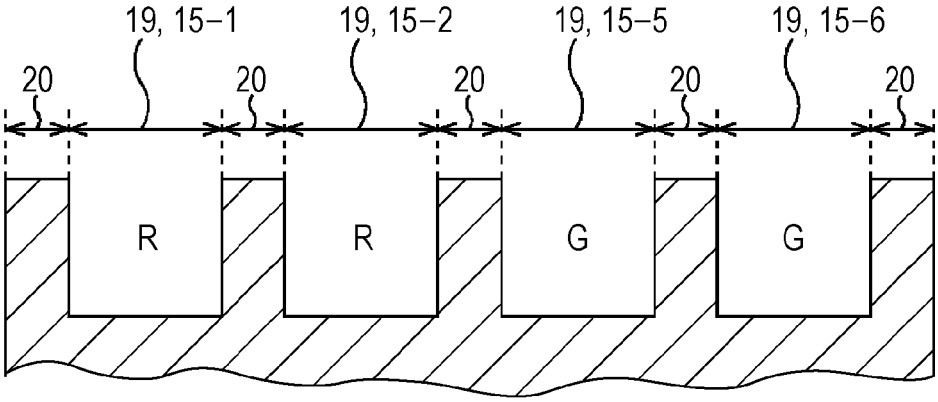
FIG. 4 is a sectional view illustrating the outline of the potential state of each divided pixel, taken along the line IV-IV in FIG. 2.

FIG. 3 is a sectional view illustrating an outline of a potential state of each divided pixel 15, taken along the line III-III in FIG. 2, and FIG. 4 is a sectional view illustrating the outline of the potential state of each divided pixel 15, taken along the line IV-IV in FIG. 2.

As shown in FIG. 3 and FIG. 4, the potential of the photodiode 19 is low, and the potential of the element isolation unit 20 is high. Moreover, the capacitance between side walls of the element isolation unit 20 increases due to a formation of the element isolation unit 20, and a saturation signal amount Qs of the photodiode 19 increases.

However, as shown in FIG. 3 and FIG. 4, the potential of the photodiode 19 toward the back side of the substrate 10 is shallow, in comparison with the surface side of the substrate 10.

Therefore, in the embodiments of the present disclosure, the element isolation unit 20 is formed on only the surface side of the substrate 10. In this manner, even when the pixels 11 to 14 are divided in order to prevent the deterioration in the transfer, it is possible to maintain the area of the opening unit 21 of the photodiode 19 and suppress the decrease in the sensitivity. That is, it is possible to prevent the deterioration in the transfer while suppressing the decrease in the sensitivity.

In addition, on the surface side of the substrate 10 where the potential is deep and the capacitance is easy to be large, the saturation signal amount Qs increases due to the capacitance between the side walls of the element isolation unit 20, and, on the back side of the substrate 10 where the potential is shallow and the capacitance is hard to be large, it is possible to increase the saturation signal amount Qs due to the volume of the photodiode 19. Accordingly, it is possible to increase the saturation signal amount Qs efficiently, and improve a dynamic range.

First Embodiment

Figure 5:
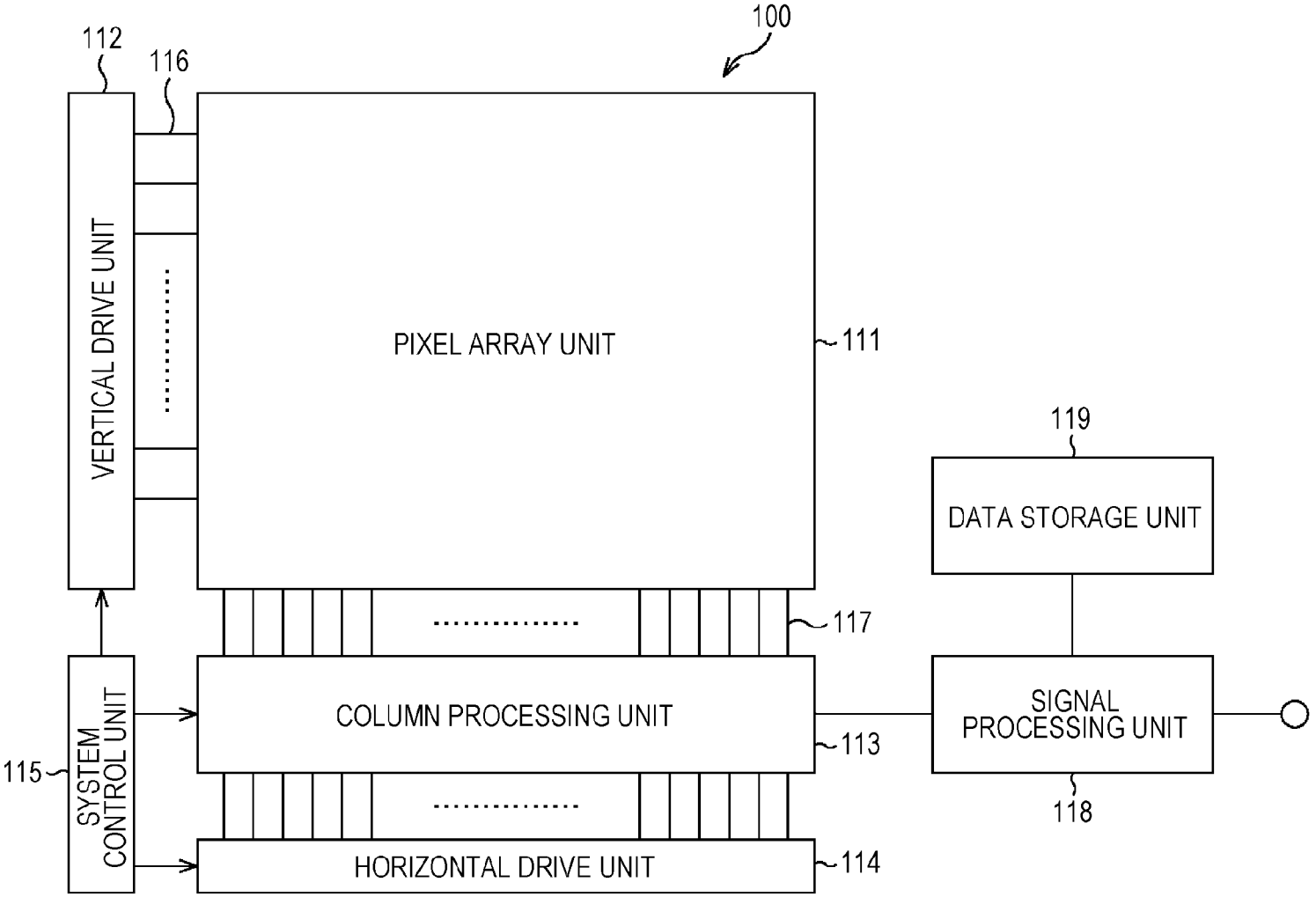
FIG. 5 is a block diagram illustrating a configuration example of the CMOS image sensor which is the back side irradiation type as a solid state imaging device according to a first embodiment to which the present disclosure is applied.

Configuration Example of Solid State Imaging Device According to an Embodiment FIG. 5 is a block diagram illustrating a configuration example of the CMOS image sensor which is the back side irradiation type as a solid state imaging device according to a first embodiment to which the present disclosure is applied.

A CMOS image sensor 100 is configured by a pixel array unit 111, a vertical drive unit 112, a column processing unit 113, a horizontal drive unit 114, a system control unit 115, a pixel drive line 116, a vertical signal line 117, a signal processing unit 118 and a data storage unit 119.

The pixel array unit 111, the vertical drive unit 112, the column processing unit 113, the horizontal drive unit 114, the system control unit 115, the pixel drive line 116, the vertical signal line 117, the signal processing unit 118 and the data storage unit 119 are formed on the substrate (chip) which is not shown in FIG. 5.

Furthermore, the CMOS image sensor 100 does not include the signal processing unit 118 and the data storage unit 119, and, for example, the signal processing unit 118 and the data storage unit 119 may be arranged as an external signal processing unit such as a DSP (Digital Signal Processor) on the substrate other than the CMOS image sensor 100.

The CMOS image sensor 100 images an image of a subject, and outputs a pixel signal of each pixel of the image.

Specifically, in the pixel array unit 111, the pixels including the photodiode such as the photoelectric conversion element that generates a charge of a charge amount according to a light amount of the incident light and accumulates the charge therein, are two-dimensionally arranged in a matrix. Each of the pixels is divided into plural divided pixels (2×2 pieces in the embodiments).

Furthermore, in the pixel array unit 111, with respect to the pixels in the matrix, the pixel drive line 116 is formed in the left and right direction (row direction) of FIG. 5 for each row and the vertical signal line 117 is formed in the up and down direction (column direction) of FIG. 5 for each column. One end of the pixel drive line 116 is connected to an output end (not shown) corresponding to each row of the vertical drive unit 112.

The vertical drive unit 112 is configured by a shift register, an address decoder or the like. The vertical drive unit 112 is a pixel drive unit that drives each pixel of the pixel array unit 111 by a row unit or the like. The specific configuration of the vertical drive unit 112 is not shown in FIG. 5, but the vertical drive unit 112 has the configuration including two scanning systems of a reading-out scanning system and a sweeping-out scanning system.

The reading-out scanning system selects each row in order and outputs a selection pulse from the output end which is connected to the pixel drive line 116 of the selected row, so as to read out the pixel signal from each pixel in order by the row unit.

The sweeping-out scanning system precedes scanning of the reading-out scanning system by a time of shutter speed and outputs a control pulse from the output end which is connected to the pixel drive line 116 of each row, in order to sweep out (reset) the unnecessary charge from the photodiode. By the scanning of the sweeping-out scanning system, a so-called electronic shutter operation is performed in order for each row. Here, an operation to discard the charge of the photodiode and start an exposure anew (start the accumulation of the charge) is referred to as the electronic shutter operation.

The pixel signal that is output from each pixel of the row selected by the reading-out scanning system of the vertical drive unit 112, is supplied to the column processing unit 113 through each vertical signal line 117.

The column processing unit 113 includes a signal processing circuit for each column of the pixel array unit 111. Each signal processing circuit of the column processing unit 113 performs a noise removal processing such as a CDS (Correlated Double Sampling) processing and a signal processing such as an A/D conversion processing, with respect to the pixel signal that is output through the vertical signal line 117 from each pixel of the selected row. By the CDS processing, a reset noise and the noise of a fixed pattern peculiar to the pixel such as a threshold variation of an amplification transistor, are removed. The column processing unit 113 temporarily holds the pixel signal after the signal processing.

The horizontal drive unit 114 is configured by the shift register, the address decoder or the like. The horizontal drive unit 114 selects the signal processing circuit of the column processing unit 113 in order. The pixel signal that is signal-processed by each signal processing circuit of the column processing unit 113, is output to the signal processing unit 118 in order, due to the scanning which is selected by the horizontal drive unit 114.

The system control unit 115 is configured by a timing generator to generate various timing signals or the like. The system control unit 115 controls the vertical drive unit 112, the column processing unit 113 and the horizontal drive unit 114, based on various timing signals which are generated by the timing generator.

The signal processing unit 118 includes at least an addition processing function. The signal processing unit 118 performs various signal processings such as the addition processing, with respect to the pixel signal which is output from the column processing unit 113. At this time, as necessary, the signal processing unit 118 stores an intermediate result of the signal processing and the like in the data storage unit 119, and refers to them at a necessary timing. The signal processing unit 118 outputs the pixel signal after the signal processing.

Configuration Example of Pixel Array Unit

Figure 6:
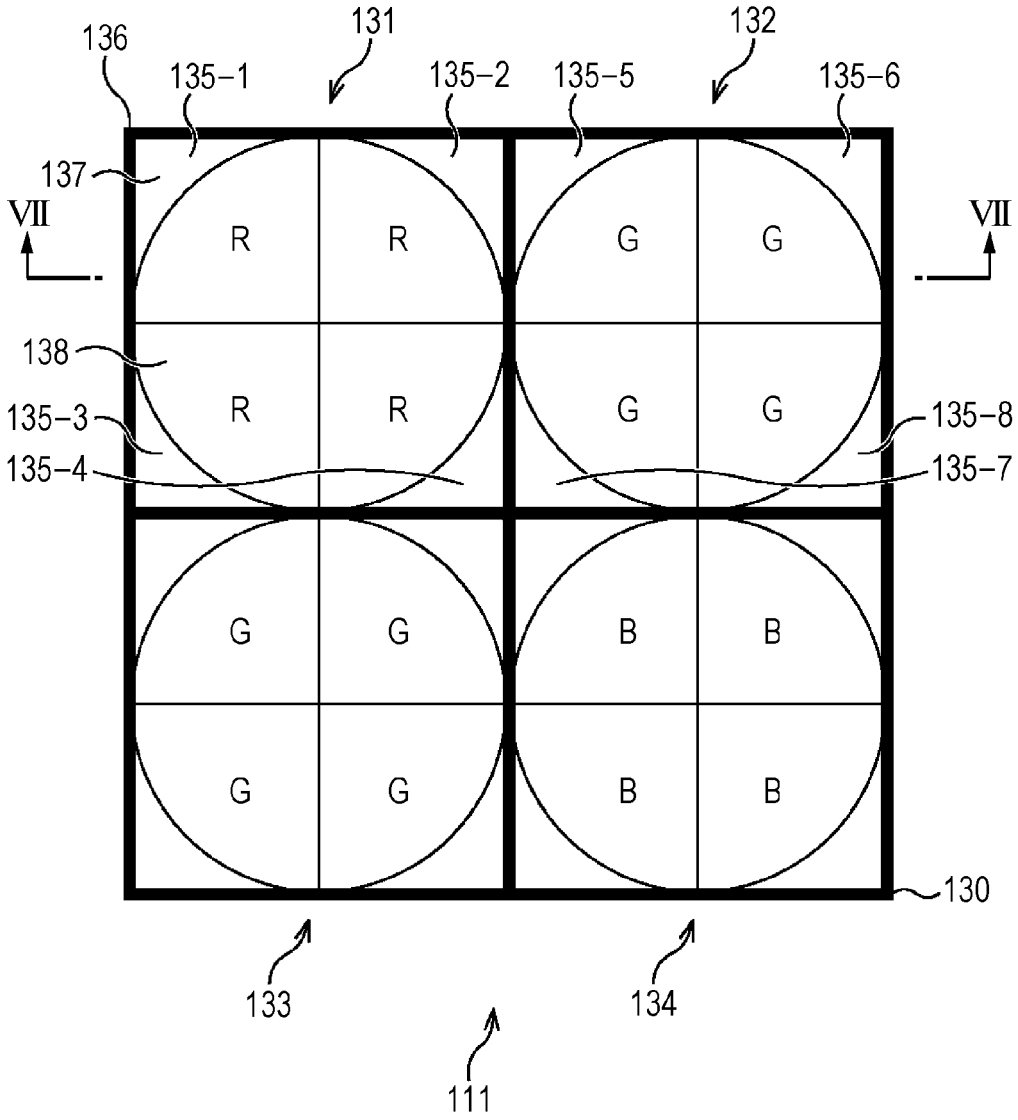
FIG. 6 is a plan view seen from the incident side of the light of a pixel array unit in FIG. 5.
Figure 7:
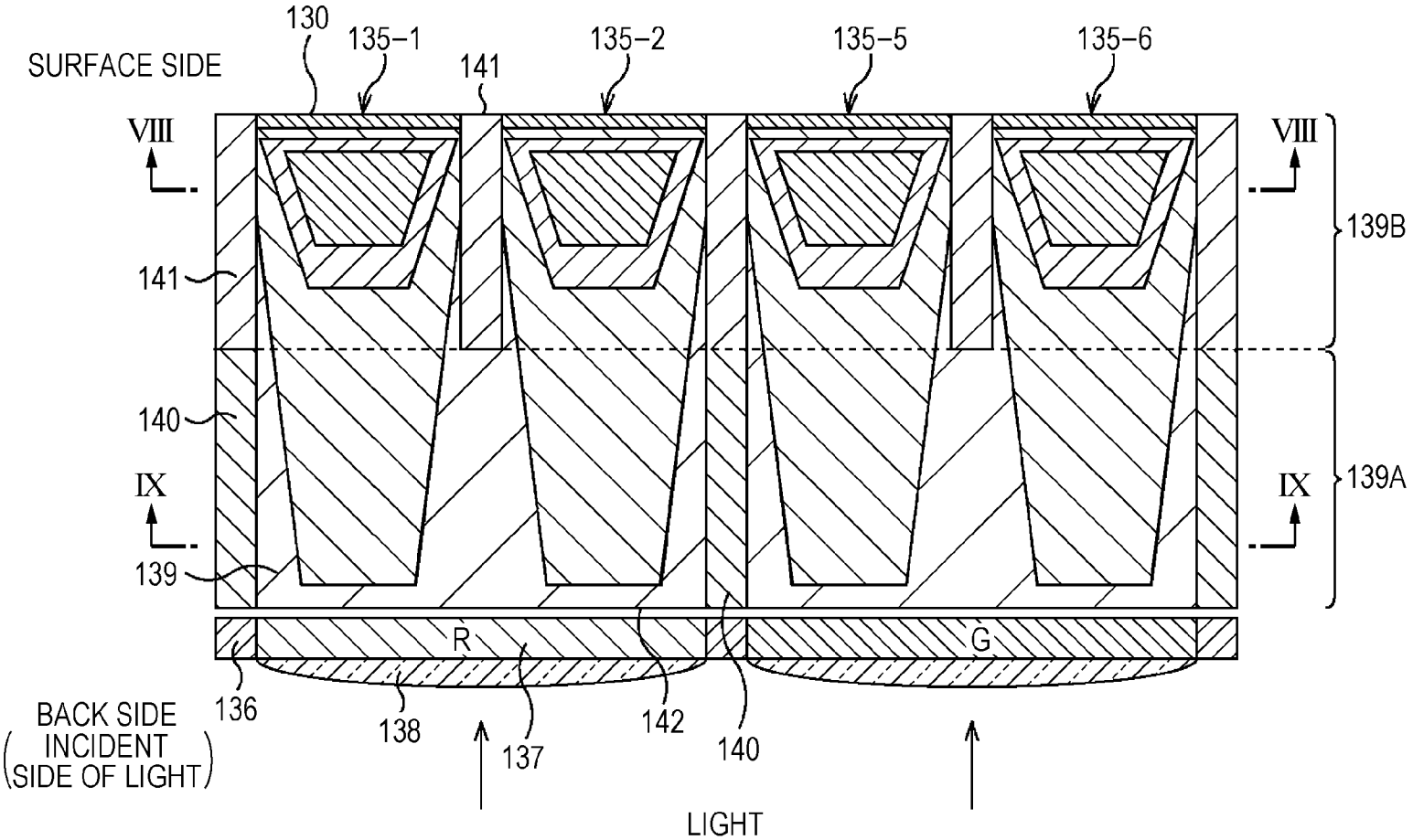
FIG. 7 is a sectional view taken along the line VII-VII in FIG. 6.

FIG. 6 is a plan view seen from the incident side of the light of the pixel array unit 111 in FIG. 5, and FIG. 7 is a sectional view taken along the line VII-VII in FIG. 6.

In FIG. 6, for the convenience of the description, only the 2×2 pieces of the pixel which is arranged in the pixel array unit 111, are shown. In the example of FIG. 6, the arrangement of each pixel is the Bayer array. That is, a pixel 131 of the upper left is the pixel of the red color (R), a pixel 132 of the upper right and a pixel 133 of the lower left are the pixels of the green color (G), and a pixel 134 of the lower right is the pixel of the blue color (B).

As shown in FIG. 6, each of the pixel 131 to the pixel 134 are divided into 2×2 pieces, and are formed on a substrate 130 of the pixel array unit 111. Specifically, the pixel 131 is formed of the four pieces as the divided pixels 135-1 to 135-4, and the pixel 132 is formed of the four pieces as the divided pixels 135-5 to 135-8. The pixel 133 and the pixel 134 are formed in the same manner.

Hereinafter, when it is not necessary to distinguish between the divided pixels 135-1 to 135-8 in particular, the divided pixels 135-1 to 135-8 are collectively referred to as a divided pixel 135. Similarly, the pixels 131 to 134 are collectively referred to as a pixel 131A.

Furthermore, as shown in FIG. 7, a photodiode 139 or the like is arranged inside the substrate 130 of the divided pixel 135. The photodiode 139 is configured by a photoelectric conversion unit 139A that is arranged by the pixel 131A unit on the back side of the substrate 130 and an accumulation unit 139B that is arranged by the divided pixel 135 unit on the surface side of the substrate 130.

The photoelectric conversion unit 139A generates the charge according to the light amount of the incident light by the pixel 131A unit, and the accumulation unit 139B divides the charge of the pixel 131A unit which is generated in the photoelectric conversion unit 139A and accumulates the charge by the divided pixel 135 unit. The charge which is accumulated by the accumulation unit 139B is transferred by the divided pixel 135 unit. Accordingly, the transfer length becomes short, and it is possible to prevent the deterioration in the transfer.

An element isolation unit 140 is formed at the boundary of the photoelectric conversion unit 139A of the pixel 131A unit, and an element isolation unit 141 is formed at the boundary of the accumulation unit 139B of the divided pixel 135 unit. Specifically, the element isolation unit 141 is arranged by the divided pixel 135 unit, and formed only as a thickness (for example, 1.5 micrometers) of the accumulation unit 139B from the surface side of the substrate 130. On the other hand, the element isolation unit 140 is arranged by the pixel 131A unit, and formed to the back side of the substrate 130 while connecting to the element isolation unit 141 of the pixel 131A unit.

That is, the element isolation unit 141 is formed at the boundary of the photodiode 139 of each divided pixel 135, and the element isolation unit 140 and the element isolation unit 141 are formed at the boundary of the photodiode 19 of the pixel 131A.

As described above, the element isolation unit 141 which is arranged at the boundary of each divided pixel 135 is not formed on the back side of the substrate 130, and thus only the element isolation unit 140 of the pixel 131A unit is formed on the back side of the substrate 130. Consequently, the size of an opening unit 142 of the photodiode 139 is the same size as the case of not dividing the pixel, and it is possible to suppress the decrease in the sensitivity.

In FIG. 7, the solid line that is described in the photodiode 139 is the contour of the potential.

Furthermore, as shown in FIG. 6 and FIG. 7, a light shielding metal 136 that shields the incident light is arranged on the back side of the substrate 130 of the element isolation unit 140. On the back side of the substrate 130 of the photoelectric conversion unit 139A of each pixel 131A, a color filter 137 of the color which is assigned to the pixel 131A, and an on-chip lens 138 that concentrates the incident light to the photoelectric conversion unit 139A are arranged in order from the substrate 130 side.

Figure 8:
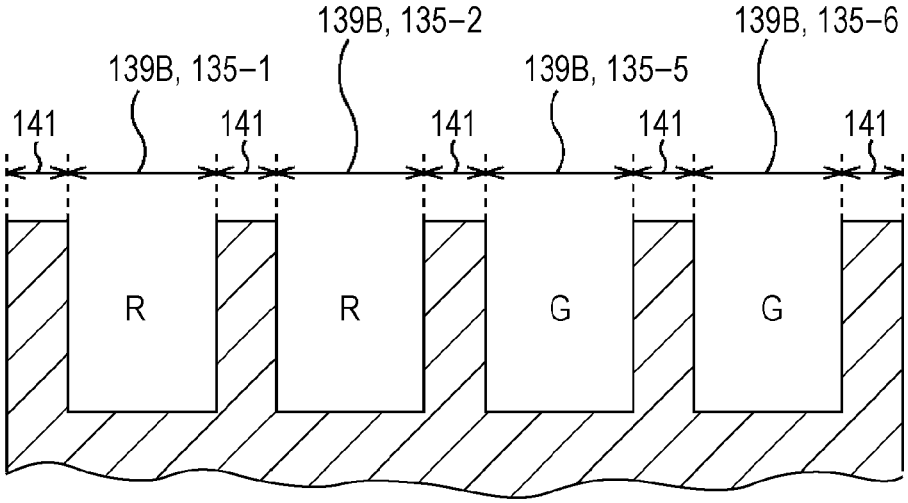
FIG. 8 is a sectional view illustrating the outline of the potential state of each divided pixel, taken along the line VIII-VIII in FIG. 7.
Figure 9:
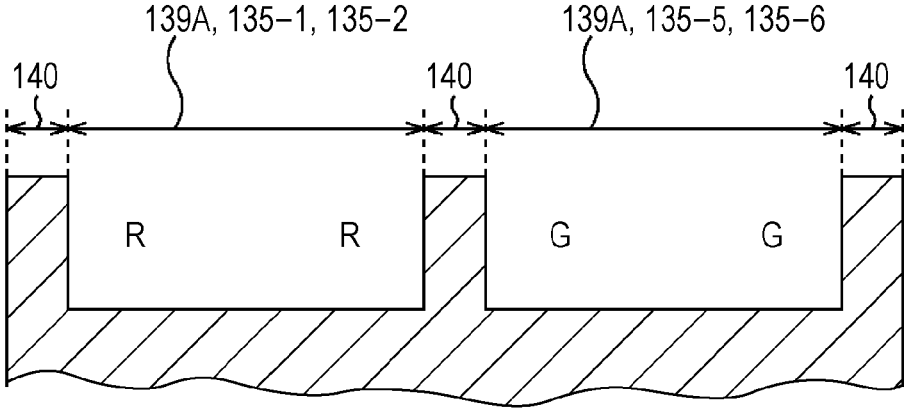
FIG. 9 is a sectional view illustrating the outline of the potential state of each divided pixel, taken along the line IX-IX in FIG. 7.

FIG. 8 is a sectional view illustrating the outline of the potential state of each divided pixel 135, taken along the line VIII-VIII in FIG. 7, and FIG. 9 is a sectional view illustrating the outline of the potential state of each divided pixel 135, taken along the line IX-IX in FIG. 7.

As shown in FIG. 8, on the surface side of the substrate 130, the potential of the accumulation unit 139B is low, and the potential of the element isolation unit 141 of the divided pixel 135 unit is high. Moreover, as shown in FIG. 9, on the back side of the substrate 130, the potential of the photoelectric conversion unit 139A is low, and the potential of the element isolation unit 140 of the pixel 131A unit is high.

In addition, as shown in FIG. 8 and FIG. 9, the potential of the photodiode 139 toward the surface side of the substrate 130 is deep, in comparison with the back side of the substrate 130. In other words, the capacitance is easy to be large on the surface side of the substrate 130, and the capacitance is hard to be large on the back side of the substrate 130.

Accordingly, in the same manner of the CMOS image sensor 100, when the element isolation unit 141 is formed by the divided pixel 135 unit on the surface side of the substrate 130, the saturation signal amount Qs efficiently increases due to the capacitance between the side walls of the element isolation unit 141. Furthermore, in the same manner of the CMOS image sensor 100, when the element isolation unit 141 is not arranged on the back side of the substrate 130, the saturation signal amount Qs efficiently increases due to the volume increase of the photodiode 139. As a result, it is possible to improve the dynamic range.

Manufacturing Method of Pixel Array Unit

Figure 10:
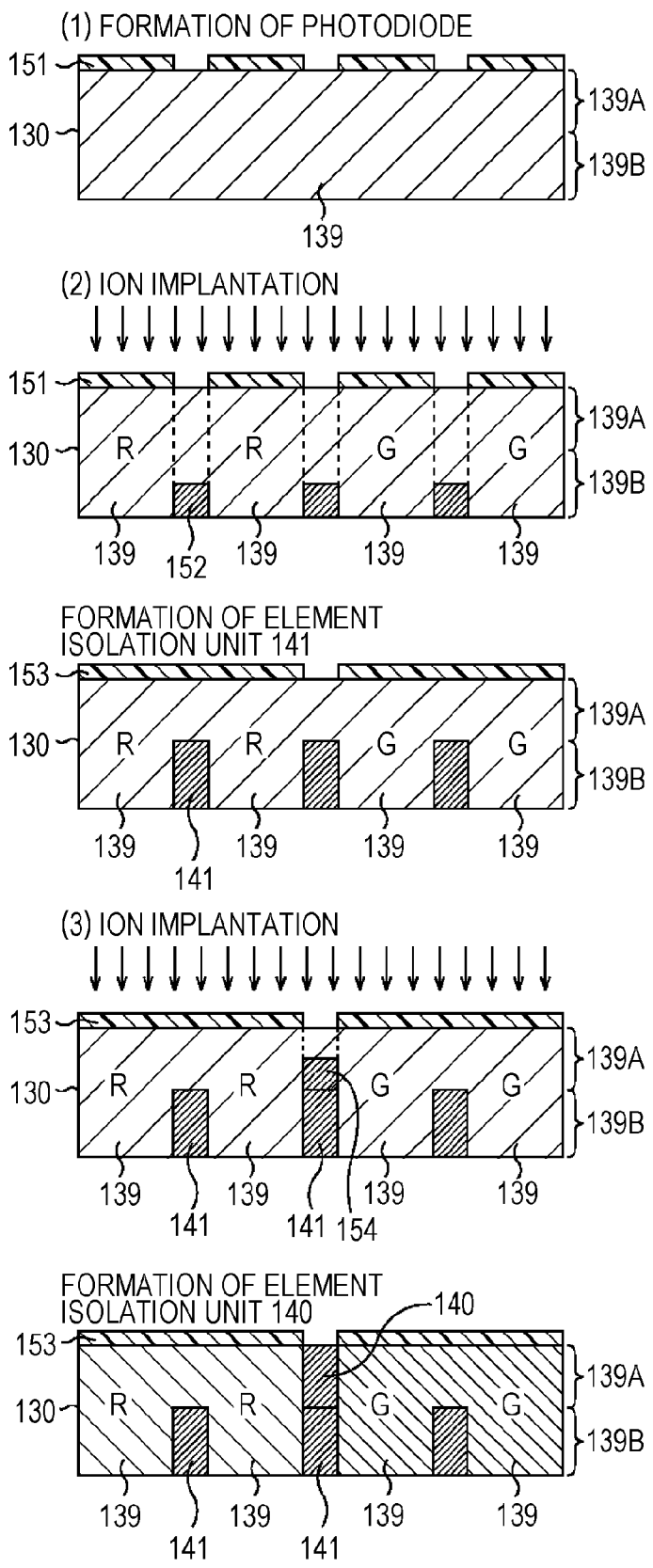
FIG. 10 is a diagram illustrating an example of a manufacturing method for a periphery of a photodiode of the pixel array unit by a manufacturing apparatus.

FIG. 10 is a diagram illustrating an example of a manufacturing method for manufacturing a periphery of the photodiode 139 of the pixel array unit 111 by a manufacturing apparatus.

As shown in FIG. 10, in a first process, the photodiode 139 which is configured of the photoelectric conversion unit 139A and the accumulation unit 139B, is formed inside the substrate 130. Therefore, a photoresist 151 is applied to the area corresponding to the accumulation unit 139B of each divided pixel 135 in an upper part of the substrate 130.

In a second process, an impurity 152 having a predetermined thickness (for example, 1.5 micrometers) is implanted into the boundary of the accumulation unit 139B to which the photoresist 151 is not supplied, by performing an ion implantation. The element isolation unit 141 is formed in this manner, and a photoresist 153 is applied to the area corresponding to the photoelectric conversion unit 139A of each pixel 131A of the upper part of the substrate 130.

In a third process, by performing the ion implantation, an impurity 154 is implanted into the back side of the substrate 130 of the element isolation unit 141 at the boundary of the photoelectric conversion unit 139A to which the photoresist 153 is not supplied, to the back side. Accordingly, the element isolation unit 140 is formed on the element isolation unit 141 at the boundary of the photoelectric conversion unit 139A of the pixel 131A.

As described above, the impurity is not implanted into the back side of the substrate 130 of the element isolation unit 141, other than the boundary of the photoelectric conversion unit 139A of the pixel 131A. Consequently, it is possible to reduce the amount of the impurity that is implanted into the substrate 130, in comparison with the case where the element isolation unit 140 is formed on the whole back side of the substrate 130 of the element isolation unit 141, and prevent an occurrence of a white spot.

Configuration Example of Second Embodiment

Configuration Example of Electronic Apparatus According to an Embodiment

Figure 11:
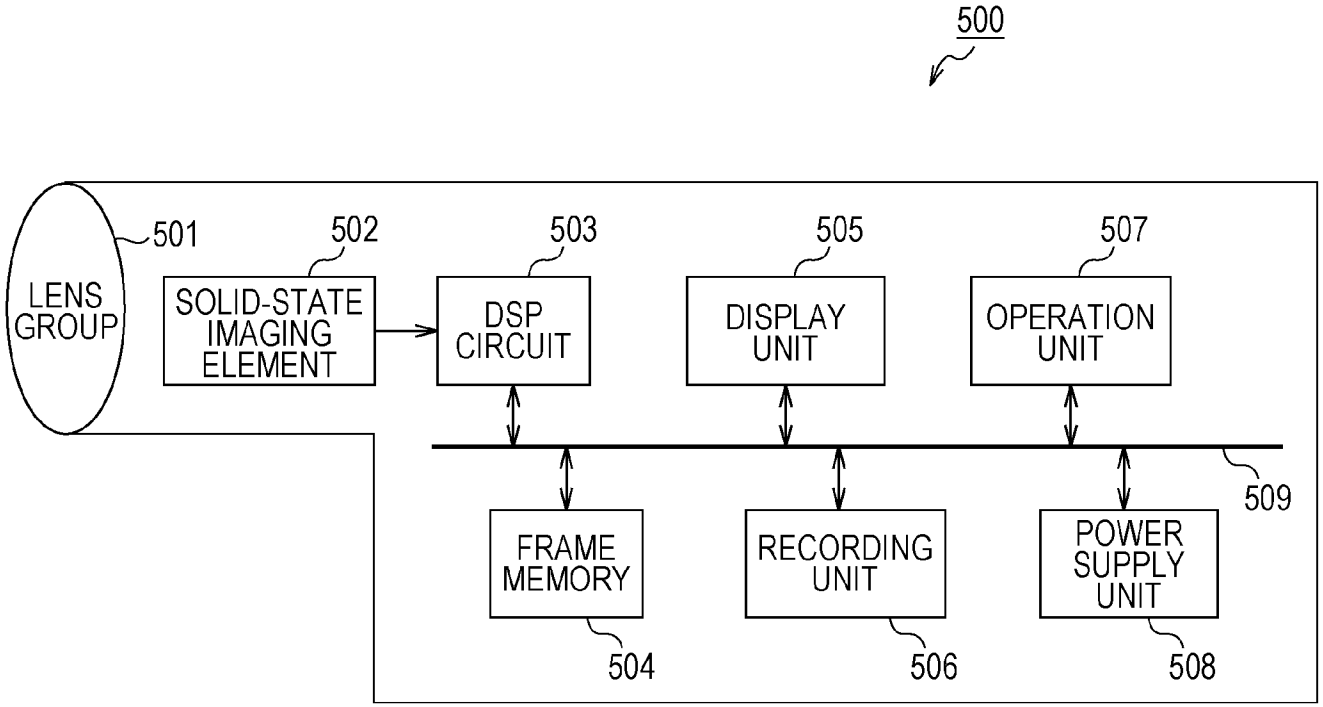
FIG. 11 is a block diagram illustrating a configuration example of an imaging device as an electronic apparatus to which the present disclosure is applied.

FIG. 11 is a block diagram illustrating a configuration example of an imaging device as an electronic apparatus to which the present disclosure is applied.

An imaging device 500 of FIG. 11 is a video camera or a digital still camera, for example. The imaging device 500 is configured of an optical unit 501, a solid state imaging device 502, a DSP circuit 503, a frame memory 504, a display unit 505, a recording unit 506, an operation unit 507 and a power supply unit 508. The DSP circuit 503, the frame memory 504, the display unit 505, the recording unit 506, the operation unit 507 and the power supply unit 508, are connected to each other via a bus line 509.

The optical unit 501 is configured of a lens group or the like. The optical unit 501 makes the image on an imaging surface of the solid state imaging device 502 by capturing the incident light (image light) from the subject. The solid state imaging device 502 is configured of the CMOS image sensor 100 described above. The solid state imaging device 502 converts the light amount of the incident light with which the image is made on the imaging surface by the optical unit 501, into an electrical signal by the pixel unit, and supplies the electrical signal as a pixel signal to the DSP circuit 503.

The DSP circuit 503 performs a predetermined image processing, with respect to the pixel signal which is supplied from the solid state imaging device 502. The DSP circuit 503 supplies an image signal after the image processing to the frame memory 504, by a frame unit, and stores the image signal temporarily.

For example, the display unit 505 is configured of a panel type display apparatus such as a liquid crystal panel and an organic EL (Electro Luminescence) panel, and displays the image, based on the pixel signal of the frame unit which is temporarily stored in the frame memory 504.

The recording unit 506 is configured of a DVD (Digital Versatile Disk), a flash memory or the like. The recording unit 506 reads out the pixel signal of the frame unit which is temporarily stored in the frame memory 504, and records the pixel signal.

The operation unit 507 issues an operation instruction to the imaging device 500 having various functions, with the operation by a user. The power supply unit 508 properly supplies a power source, with respect to the DSP circuit 503, the frame memory 504, the display unit 505, the recording unit 506 and the operation unit 507.

The electronic apparatus to which the present technique is applied, may be any type of the electronic apparatus, if the solid state imaging device is used in an image capturing unit (photoelectric conversion unit). In addition to the imaging device 500, the electronic apparatus is a portable terminal apparatus having an imaging function, a copying machine in which the solid state imaging device is used in an image reading unit, or the like.

Moreover, the CMOS image sensor may have a form that is formed as one chip, or a module type form with the imaging function which is packaged including the optical unit or the like.

The embodiments of the present disclosure is not limited to the embodiments described above, and various modifications are possible within a range that does not deviate from the scope of the present disclosure.

For example, the present disclosure may be applied to a surface side irradiation type CMOS image sensor other than the back side irradiation type CMOS image sensor, and the solid state imaging device such as a CCD (Charge Coupled Device).

Furthermore, a position of the vertical direction to the substrate 130 of the element isolation unit 141 may be suitable, if the position corresponds to the area where the potential of the photodiode 139 is relatively deep. The position of the vertical direction to the substrate 130 of the element isolation unit 141 is not limited to the position of 1.5 micrometers from the surface of the substrate 130.

The present disclosure may be configured as follows.

(1) A solid state imaging device including: a substrate, in which the substrate includes a photoelectric conversion unit that generates a charge according to a light amount of incident light by a pixel unit, an accumulation unit that divides the charge of the pixel unit which is generated in the photoelectric conversion unit and accumulates the charge, a first element isolation unit that is formed at a boundary of the photoelectric conversion unit of the pixel unit, and a second element isolation unit that is formed at a boundary of the accumulation unit of a divided unit of the pixel.

(2) The solid state imaging device according to the above (1), in which the photoelectric conversion unit is formed on a side which is irradiated with the incident light from the accumulation unit, and the first element isolation unit is formed on the side which is irradiated with the incident light from the second element isolation unit.

(3) The solid state imaging device according to the above (1) or (2), further including: a light shielding unit that is arranged on the substrate of the first element isolation unit to shield the incident light.

(4) The solid state imaging device according to any one of the above (1) to (3), further including: a color filter of a color that is arranged on the substrate of the photoelectric conversion unit to be assigned to the pixel corresponding to the photoelectric conversion unit.

(5) The solid state imaging device according to any one of the above (1) to (4), further including: a lens that is arranged on the substrate of the photoelectric conversion unit to concentrate the incident light to the photoelectric conversion unit.

(6) A manufacturing method for a manufacturing apparatus of a solid state imaging device, including: forming a photoelectric conversion unit that generates a charge according to a light amount of incident light by a pixel unit on a substrate; forming an accumulation unit that divides the charge of the pixel unit which is generated in the photoelectric conversion unit and accumulates the charge on the substrate; forming a first element isolation unit that is formed at a boundary of the photoelectric conversion unit of the pixel unit on the substrate; and forming a second element isolation unit that is formed at a boundary of the accumulation unit of a divided unit of the pixel on the substrate.

(7) An electronic apparatus including: a substrate, in which the substrate includes a photoelectric conversion unit that generates a charge according to a light amount of incident light by a pixel unit, an accumulation unit that divides the charge of the pixel unit which is generated in the photoelectric conversion unit and accumulates the charge, a first element isolation unit that is formed at a boundary of the photoelectric conversion unit of the pixel unit, and a second element isolation unit that is formed at a boundary of the accumulation unit of a divided unit of the pixel.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging device comprising:

[a plurality of pixels, wherein] at least one pixel [of the plurality of pixels includes] *including*:

a photoelectric conversion [unit] *region disposed in a substrate and* that generates [a] charge*s* for the at least one pixel according to an amount of incident light, a plurality of accumulation [units] *regions* that divide[s] the [charge of the at least one pixel generated in the photoelectric conversion unit and] *photoelectric conversion region such that each accumulation region* accumulates *a portion of* the [divided] charge*s*, [wherein the plurality of accumulation units accumulates the divided charge from the same photoelectric conversion unit of the at least one pixel,]

*an on-chip lens including a convex portion that passes the incident light, the convex portion covering at least part of each accumulation region,* a first *isolation* element [isolation unit] that is formed at a boundary of the photoelectric conversion [unit of the at least one pixel and] *region so as to be* between [a] *the* photoelectric conversion [unit of] *region and* an adjacent pixel, and a second *isolation* element [isolation unit] that is formed between each accumulation [unit] *region* of the plurality of accumulation [units] *regions* of the at least one pixel[and between another accumulation unit of an adjacent pixel], *wherein the first isolation element and the second isolation element are formed to different depths in the substrate.*

[2. The imaging device according to claim 1, wherein the photoelectric conversion unit is formed on a side of a substrate which is irradiated with the incident light, and the first element isolation unit is formed on the side of the substrate which is irradiated with the incident light.]

[3. The imaging device according to claim 1, further comprising a light shielding unit that is arranged on a substrate of the first element isolation unit to shield the incident light.]

[4. The imaging device according to claim 1, wherein a color filter is arranged on a substrate of the photoelectric conversion unit.]

[5. The imaging device according to claim 1, further comprising a lens that is arranged on a substrate of the photoelectric conversion unit to concentrate the incident light to the photoelectric conversion unit.]

[6. The imaging device of claim 1, wherein the plurality of accumulation units is located between the photoelectric conversion unit and a surface side of a substrate containing the at least one pixel.]

[7. A method of manufacturing an imaging device, comprising:

forming, on a substrate, a photoelectric conversion unit that generates a charge for a pixel according to an amount of incident light;

forming, on the substrate, a plurality of accumulation units that divides the charge of the pixel generated in the photoelectric conversion unit and accumulates the divided charge, wherein the plurality of accumulation units accumulates the divided charge from the same photoelectric conversion unit of the pixel;

forming, on the substrate, a first element isolation unit at a boundary of the photoelectric conversion unit of the pixel and between a photoelectric conversion unit of an adjacent pixel; and forming, on the substrate, a second element isolation unit between each accumulation unit of the plurality of accumulation units of the pixel and between another accumulation unit of an adjacent pixel.]

[8. The method of manufacturing according to claim 7, further comprising:

forming the photoelectric conversion unit on a side which is irradiated with the incident light, and forming the first element isolation unit on the side which is irradiated with the incident light.]

[9. The manufacturing method according to claim 7, further comprising forming a light shielding unit that is arranged on the substrate of the first element isolation unit to shield the incident light.]

[10. The manufacturing method according to claim 7, further comprising forming a color filter on the substrate of the photoelectric conversion unit.]

[11. The manufacturing method according to claim 7, further comprising forming a lens on the substrate of the photoelectric conversion unit to concentrate the incident light to the photoelectric conversion unit.]

[12. An electronic apparatus comprising:

a substrate including a plurality of pixels, wherein at least one pixel of the plurality of pixels includes:

a photoelectric conversion unit that generates a charge for the at least one pixel according to an amount of incident light, a plurality of accumulation units that divides the charge of the at least one pixel generated in the photoelectric conversion unit and accumulates the divided charge, wherein the plurality of accumulation units accumulates the divided charge from the same photoelectric conversion unit of the at least one pixel, a first element isolation unit that is formed at a boundary of the photoelectric conversion unit of the at least one pixel and between a photoelectric conversion unit of an adjacent pixel, and a second element isolation unit that is formed between each accumulation unit of the plurality of accumulation units of the at least one pixel and between another accumulation unit of an adjacent pixel.]

[13. The electronic apparatus according to claim 12, wherein the photoelectric conversion unit is formed on a side of the substrate which is irradiated with the incident light, and the first element isolation unit is formed on the side of the substrate which is irradiated with the incident light.]

[14. The electronic apparatus according to claim 12, further comprising a light shielding unit that is arranged on the substrate of the first element isolation unit to shield the incident light.]

[15. The electronic apparatus according to claim 12, further comprising a color filter arranged on the substrate of the photoelectric conversion unit.]

[16. The electronic apparatus according to claim 12, further comprising a lens that is arranged on the substrate of the photoelectric conversion unit to concentrate the incident light to the photoelectric conversion unit.]

*17. A back side irradiation type imaging device comprising:*

*a first pixel comprising:*

*a first divided pixel and a second divided pixel;*

*a first isolation region disposed between the first divided pixel and the second divided pixel;*

*a first on-chip lens corresponding to the first pixel; and*

*a first color filter corresponding to the first pixel; and*

*a second pixel disposed adjacent to the first pixel, the second pixel comprising:*

*a second on-chip lens corresponding to the second pixel; and*

*a second color filter corresponding to the second pixel; and*

*a second isolation region disposed between the first pixel and the second pixel,*

*wherein a length of the first isolation region is different from a length of the second isolation region, and*

*wherein the length of the first isolation region and the length of the second isolation region are in a depth direction of a semiconductor substrate.*

*18. The back side irradiation type imaging device according to claim 17, wherein the depth direction of the semiconductor substrate is perpendicular to a first surface of the semiconductor substrate.*

*19. The back side irradiation type imaging device according to claim 17, wherein the length of the first isolation region is smaller than the length of the second isolation region.*

*20. The back side irradiation type imaging device according to claim 17, wherein the first isolation region comprises a first end and a second end in the depth direction of the semiconductor substrate, wherein the first end is disposed between a first surface of the semiconductor substrate and a second surface of the semiconductor substrate, the second surface being opposite the first surface.*

*21. The back side irradiation type imaging device according to claim 20, wherein the second end is disposed at the first surface of the semiconductor substrate.*

*22. The back side irradiation type imaging device according to claim 21, wherein the first surface of the semiconductor substrate is opposite a light incident side of the semiconductor substrate.*

*23. The back side irradiation type imaging device according to claim 17, wherein the second isolation region comprises a first end and a second end in the depth direction of the semiconductor substrate, wherein the first end is disposed at a first surface of the semiconductor substrate.*

*24. The back side irradiation type imaging device according to claim 23, wherein the second end is disposed at a*

*second surface of the semiconductor substrate, the second surface of the semiconductor substrate being opposite the first surface of the semiconductor substrate.*

*25. The back side irradiation type imaging device according to claim 17, wherein the first isolation region comprises an impurity.*

*26. The back side irradiation type imaging device according to claim 17, wherein the second isolation region comprises an impurity.*

*27. The back side irradiation type imaging device according to claim 17, further comprising a light shield disposed between the first pixel and the second pixel and disposed above a first surface of the semiconductor substrate, the first surface being a light incident side of the semiconductor substrate.*

*28. The back side irradiation type imaging device according to claim 17, wherein the second pixel comprises:*

*a third divided pixel and a fourth divided pixel; and*

*a third isolation region disposed between the third divided pixel and the fourth divided pixel.*

*29. The back side irradiation type imaging device according to claim 28, wherein a length of the third isolation region is different from the length of the second isolation region and wherein the length of the third isolation region is in the depth direction of the semiconductor substrate.*

*30. The back side irradiation type imaging device according to claim 17, wherein the first color filter bandpasses first light and wherein the second color filter bandpasses second light which is different from the first light.*

*31. The back side irradiation type imaging device according to claim 17, wherein the first color filter bandpasses green light.*

*32. The back side irradiation type imaging device according to claim 31, wherein the second color filter bandpasses blue light or red light.*

*33. The back side irradiation type imaging device according to claim 17, wherein the first color filter bandpasses blue light.*

*34. The back side irradiation type imaging device according to claim 17, wherein the first color filter bandpasses red light.*

*35. The back side irradiation type imaging device according to claim 17, wherein the first pixel further comprises a third divided pixel and a fourth divided pixel.*

*36. The back side irradiation type imaging device according to claim 35, wherein the first pixel further comprises third, fourth, and fifth isolation regions disposed between the first divided pixel and the third divided pixel, the third divided pixel and the fourth divided pixel, and the second divided pixel and the fourth divided pixel, respectively.*

*37. An imaging apparatus comprising:*

*an optical unit*

*the back side irradiation type imaging device according to claim 17;*

*a digital signal processing circuit; and*

*a display unit.*

* * * * *